United States Patent
Hori et al.

(10) Patent No.: US 10,512,149 B2
(45) Date of Patent: Dec. 17, 2019

(54) EXTREME UV LIGHT GENERATION DEVICE

(71) Applicant: Gigaphoton Inc., Tochigi (JP)

(72) Inventors: Tsukasa Hori, Oyama (JP); Shinji Okazaki, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/214,435

(22) Filed: Dec. 10, 2018

(65) Prior Publication Data
US 2019/0116655 A1 Apr. 18, 2019

Related U.S. Application Data

(63) Continuation of application No. PCT/JP2016/071288, filed on Jul. 20, 2016.

(51) Int. Cl.
*H05G 2/00* (2006.01)
*G21K 1/06* (2006.01)
*G21K 1/14* (2006.01)
*G03F 7/20* (2006.01)

(52) U.S. Cl.
CPC .............. *H05G 2/008* (2013.01); *G03F 7/20* (2013.01); *G21K 1/06* (2013.01); *G21K 1/14* (2013.01)

(58) Field of Classification Search
CPC ............ H05G 2/008; H05G 2/00; G21K 1/06; G21K 1/14
USPC ................. 250/493.1, 503.1, 504 R
See application file for complete search history.

(56) References Cited

FOREIGN PATENT DOCUMENTS

| JP | S63-299041 A | 12/1988 |
|---|---|---|
| JP | 2002-030446 A | 1/2002 |
| JP | 2006-176819 A | 7/2006 |
| JP | 2008-016753 A | 1/2008 |
| JP | 2013-084993 A | 5/2013 |

OTHER PUBLICATIONS

International Search Report issued in PCT/JP2016/071288; dated Oct. 18, 2016.
Wtitten Opinion issued in PCT/JP2016/071288; dated Oct. 18, 2016.

*Primary Examiner* — Nicole M Ippolito
*Assistant Examiner* — Hanway Chang
(74) *Attorney, Agent, or Firm* — Studebaker & Brackett PC

(57) ABSTRACT

An extreme UV light generation device may include: a chamber having a plasma generation region at an inside of the chamber, the chamber receiving a target substance externally supplied to the plasma generation region; an outlet port provided on the chamber; a magnetic field generating unit configured to generate a magnetic field to converge cations on the outlet port, the cations being generated from the target substance that has been turned into plasma in the plasma generation region; an electron emission unit configured to emit electrons neutralizing the cations; and an exhaust tube joined to the outlet port and through which a neutralized substance obtained by neutralizing the cations flows.

13 Claims, 11 Drawing Sheets

EXTREME UV LIGHT GENERATION DEVICE

CROSS-REFERENCE TO RELATED APPLICATION

The present application is a continuation application of International Application No. PCT/JP2016/071288 filed on Jul. 20, 2016. The content of the application is incorporated herein by reference in its entirety.

BACKGROUND

1. Technical Field

The present disclosure relates to an extreme UV light generation device.

2. Related Art

Nowadays, transfer patterns for use in photolithography in semiconductor processes are becoming finer and finer with semiconductor processes being moved to microfabrication. In next generation processes, fine patterning with a line width of 20 nm or less is to be requested. Thus, the development of exposure apparatuses is expected. These exposure apparatuses combine a device that generates extreme ultraviolet (EUV) light at a wavelength of about 13 nm with reduced projection reflective optics.

For extreme UV light generation devices, three types of devices are proposed. The three types are: a laser produced plasma (LPP) device that uses plasma generated by applying a laser beam to a target substance; a discharge produced plasma (DPP) device that uses plasma generated by electric discharge; and a synchrotron radiation (SR) device that uses synchrotron orbital radiation.

CITATION LIST

Patent Literature

[Patent Literature 1] JP 2002-030446 A
[Patent Literature 2] JP 2006-176819 A
[Patent Literature 3] JP S63-299041 A

SUMMARY

An extreme UV light generation device according to one aspect of the present disclosure may include a chamber, an outlet port, a magnetic field generating unit, an electron emission unit, and an exhaust tube. The chamber may have a plasma generation region at an inside of the chamber, the chamber receiving a target substance externally supplied to the plasma generation region. The outlet port may be provided on the chamber. The magnetic field generating unit may be configured to generate a magnetic field to converge cations on the outlet port, the cations being generated from the target substance that has been turned into plasma in the plasma generation region. The electron emission unit may be configured to emit electrons neutralizing the cations. The exhaust tube may be joined to the outlet port, and a neutralized substance obtained by neutralizing the cations flows through the exhaust tube.

BRIEF DESCRIPTION OF THE DRAWINGS

In the following, some embodiments of the present disclosure will be described as simple examples with reference to the accompanying drawing.

DETAILED DESCRIPTION

1. Overview
2. Description of an Extreme UV Light Generation Device
   2.1 Overall Configuration
   2.2 Operation
3. Comparative Example
   3.1 Configuration of a Part of an Extreme UV Light Generation Device
   3.2 Operation
   3.3 Problem
4. First Embodiment
   4.1 Configuration of a Part of an Extreme UV Light Generation Device
   4.2 Operation
   4.3 Effect
5. Second Embodiment
   5.1 Configuration of a Part of an Extreme UV Light Generation Device
   5.2 Operation
   5.3 Effect
6. Third Embodiment
   6.1 Configuration of a Part of an Extreme UV Light Generation Device
   6.2 Operation
   6.3 Effect
7. Fourth Embodiment
   7.1 Configuration of a Part of an Extreme UV Light Generation Device
   7.2 Operation
   7.3 Effect
8. Exemplifying Modification In the following, embodiments of the present disclosure will be described in detail with reference to the drawings.

The embodiments to be described below show some examples of the present disclosure, and do not limit the content of the present disclosure. All the configurations and the operations to be described in the embodiments are not necessarily required as the configurations and operations of the present disclosure.

Note that the same components are designated by the same reference signs, and redundant descriptions will be omitted.

1. Overview

Embodiments of the present disclosure relate to an extreme UV light generation device that generates light with wavelengths referred to as extreme ultraviolet (EUV) light. Note that in the present specifications below, the extreme ultraviolet light is sometimes referred to as EUV light.

2. Description of an Extreme UV Light Generation Device

2.1 Overall Configuration

Figure 1:
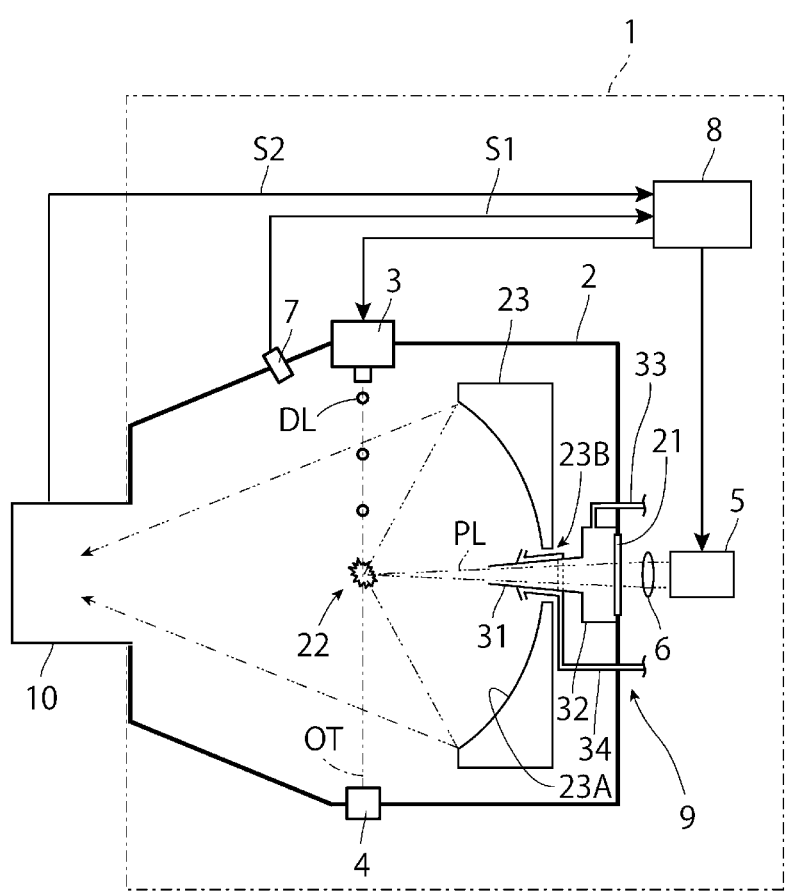
FIG. 1 is a schematic diagram of an overall exemplifying configuration of an extreme UV light generation device.

As shown in FIG. 1, an extreme UV light generation device 1 according to this embodiment is used together with an exposure apparatus 10. The extreme UV light generation device 1 includes a chamber 2, a target supply unit 3, a target collecting unit 4, a laser device 5, a laser focusing optical system 6, a target sensor 7, a controller 8, and an etching gas supply unit 9.

The chamber 2 is a sealable, pressure-reducible container. The target supply unit 3 supplies a target substance as a droplet DL to the inside of the chamber 2. The target supply unit 3 is mounted so as, for example, to penetrate through the wall of the chamber 2. The material of a target substance to be supplied from the target supply unit 3 may include, but is not limited to, any one of tin, terbium, gadolinium, lithium, and xenon or the combination of two or more of them.

On the wall of the chamber 2, at least one through hole is provided. The through hole is blocked with a window 21. The window 21 transmits a pulsed laser beam PL emitted from the laser device 5 that is placed on the outside of the chamber 2.

At the inside of the chamber 2, a predetermined region on a trajectory OT of a droplet DL supplied to the inside of the chamber 2 is a plasma generation region 22 in which the droplet DL is turned into plasma. On the plasma generation region 22, a pulsed laser beam PL emitted from the laser device 5 is focused.

At the inside of the chamber 2, a collector mirror 23 is provided. The collector mirror 23 reflects EUV light, which is included in light generated by turning the droplet DL into plasma in the plasma generation region 22, off a reflection plane 23A, focuses the light on the focal point, and delivers the light to the exposure apparatus 10. The reflection plane 23A of the collector mirror 23 is, for example, a spheroidal reflection plane.

The target collecting unit 4 collects droplets DL that are not turned into plasma in the plasma generation region 22 among the droplets DL having been supplied to the inside of the chamber 2. For example, the target collecting unit 4 is provided on the wall of the chamber 2 opposite to the wall, on which the target supply unit 3 is mounted, on the trajectory OT of the droplet DL.

The laser device 5 emits the pulsed laser beam PL having a predetermined pulse duration. For example, the laser device 5 may be a solid laser device, such as a Nd:YAG laser or a Nd:YVO4 laser, or may emit the harmonic light of a solid laser device. For example, the laser device 5 may be a gas laser device, such as a $CO_2$ laser or an excimer laser. For example, the laser device 5 may emit the pulsed laser beam PL that is a linearly polarized laser beam. The pulse duration may be a pico-second pulse duration that is 100 fS or more and less than 1 nS, or may be a nano-second pulse duration that is 1 nS or more. Note that the laser device 5 may alternately emit a prepulsed laser beam and a main pulsed laser beam in a predetermined pulse unit in a burst period.

The laser focusing optical system 6 is an optical system that focuses the pulsed laser beam PL emitted from the laser device 5 on the plasma generation region 22. In the embodiment, the laser focusing optical system 6 is entirely provided on the outside of the chamber 2. However, a part of the laser focusing optical system 6 may be provided to the inside of the chamber 2. A part of the laser focusing optical system 6 may be provided on a stage movable in three axial directions to change the focus position on which light is focused with the laser focusing optical system 6.

The target sensor 7 is provided so as, for example, to penetrate the wall of the chamber 2. The target sensor 7 detects the presence, trajectory, position, speed, and any other parameters of the droplet DL supplied to the inside of the chamber 2, and supplies a detection signal S1 obtained as a detected result to the controller 8.

The controller 8 is configured to control the entire extreme UV light generation device 1. The controller 8 receives at least an input of the detection signal S1 from the target sensor 7, and an input of a burst signal S2 from the exposure apparatus 10.

The burst signal S2 is a signal that specifies a burst period for which EUV light has to be generated and an idle period for which the generation of EUV light has to be stopped. In the burst signal S2, the burst period and the idle period are repeated. A burst pattern is defined by data including any one or a plurality of the energy of EUV light, the repetition frequency, the number of pulses, the length of the burst period, the length of the idle period, and the number of bursts. The burst pattern is set at the exposure apparatus 10.

The controller 8 appropriately controls the laser device 5 based on the detection signal S1 and the burst signal S2 in such a manner that the pulsed laser beam PL is applied when the droplet DL reaches the plasma generation region 22 in the burst period.

Note that the controller 8 may control the target supply unit 3 based on the signal, such as the detection signal S1, in such a manner that, for example, the output timing and the output direction of the droplet DL are adjusted. The controller 8 may control the laser focusing optical system 6 based on the signal, such as the detection signal S1, in such a manner that the pulsed laser beam PL is applied to a predetermined target position in the plasma generation region 22. The control methods are merely examples. The control method may be replaced by another control method other than the control methods described above, or another control method may be additionally provided.

The etching gas supply unit 9 supplies a gas that reacts with debris and cations generated by turning the droplet DL into plasma to the inside of the chamber 2. In the case in which the material of the droplet DL that is a target substance is tin, a gas supplied from the etching gas supply unit 9 includes, for example, hydrogen gas or hydrogen. In this case, tin fine particles and tin ions generated by turning the droplet DL into plasma react with hydrogen, and are turned into a stannane gas at room temperature. Here, debris means fine particles of a target substance.

The etching gas supply unit 9 includes a nozzle 31, for example, in a truncated cone outer shape. The nozzle 31 is inserted into a through hole 23B provided on the collector mirror 23. The tip end of the nozzle 31 protrudes from the reflection plane 23A of the collector mirror 23. The nozzle 31 is fixed to a base 32. The nozzle 31 supplies an etching gas delivered from a gas supply source, not shown, to the inside of the chamber 2 toward the plasma generation region 22 in turn through a first gas inlet tube 33 and the base 32.

On the outer circumferential surface of the nozzle 31, a second gas inlet tube 34 is mounted. The output end of the second gas inlet tube 34 is directed to the reflection plane 23A of the collector mirror 23. The nozzle 31 supplies an etching gas delivered from a gas supply source, not shown, to the inside of the chamber 2 through a second gas inlet tube 34 toward the reflection plane 23A of the collector mirror 23.

2.2 Operation

The controller 8 causes the laser device 5 to emit the pulsed laser beam PL in the burst period. The laser focusing optical system 6 focuses the pulsed laser beam PL emitted from the laser device 5 on the plasma generation region 22 at the inside of the chamber 2 through the window 21 of the chamber 2.

Here, the controller 8 controls the laser device 5 to apply the pulsed laser beam PL when the droplet DL reaches the plasma generation region 22 in the burst period. Thus, the pulsed laser beam PL is applied to the droplet DL that has been supplied from the target supply unit 3 to the inside of the chamber 2 and has reached the plasma generation region 22.

The droplet DL, to which the pulsed laser beam PL has been applied, is turned into plasma, and light including EUV light is emitted from the plasma. The EUV light is selectively reflected off the reflection plane 23A of the collector mirror 23, and guided to the exposure apparatus 10 provided on the outside of the chamber 2.

Note that the droplet DL reaches the plasma generation region 22, the prepulsed laser beam is applied to the droplet DL to disperse the target substance, and then the main pulsed laser beam is applied to the dispersed target substances to turn the dispersed target substance into plasma. In this case, the prepulsed laser beam and the main pulsed laser beam can be emitted from the laser device 5 as described above. This configuration enables the improvement of the conversion efficiency (CE) of the laser beams into the energy of EUV light.

In the case in which the droplet DL is turned into plasma, light including EUV light is emitted and debris and cations are dispersed. A part of debris and cations reacts with the etching gas supplied from the etching gas supply unit 9 to the inside of the chamber 2, and the reacted part changes into a gas. Thus, sputtering to the window 21 and the reflection plane 23A of the collector mirror 23, which is caused by the deposition of debris and the collision of cations, is reduced. The energy of cations sometimes reaches a few kilo-electron volts. This causes sputtering to the reflection plane 23A of the collector mirror 23. With the advance of sputtering, the reflectance of the reflection plane 23A is decreased, and this possibly decreases the delivery of EUV light to be delivered to the exposure apparatus 10.

3. Comparative Example

3.1 Configuration of a Part of an Extreme UV Light Generation Device

Next, as a comparative example with embodiments below, the configuration of a part of an extreme UV light generation device will be described. Note that configurations similar to the configurations described above are designated by the same reference signs, and redundant descriptions will be omitted unless otherwise specified.

Figure 2:
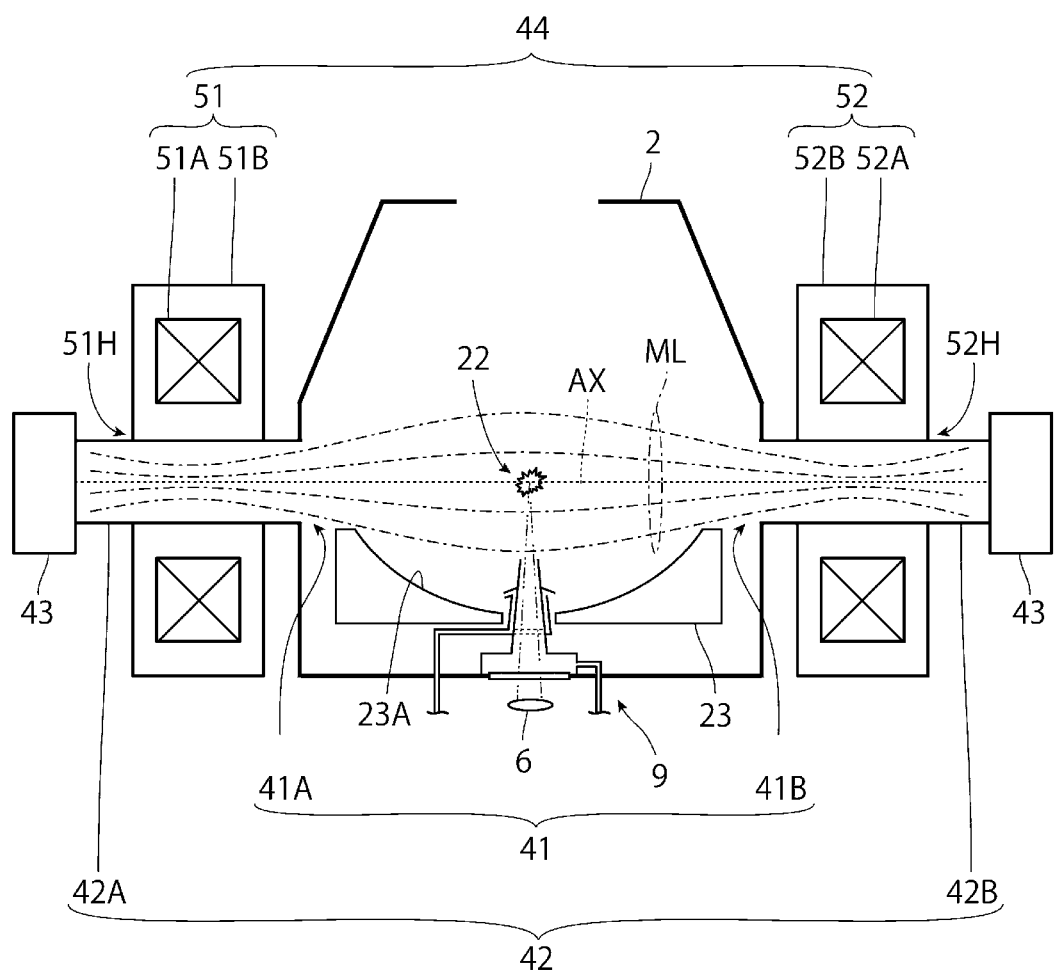
FIG. 2 is a schematic diagram of an exemplifying configuration of a part of an extreme UV light generation device according to a comparative example.

As shown in FIG. 2, the extreme UV light generation device according to the comparative example includes, in addition to the configurations above, an outlet port 41, an exhaust tube 42, exhausters 43, and a magnetic field generating unit 44, as a mechanism that exhausts debris and cations generated from the target substance having been turned into plasma and a gas generated from the debris and cations having reacted with the etching gas. Note that in FIG. 2, for convenience, a target supply unit 3, a target collecting unit 4, a laser device 5, and a target sensor 7, a controller 8 are omitted.

The outlet port 41 is an opening that penetrates the walls of a chamber 2. The outlet port 41 has an outlet port 41A provided on one wall of the chamber 2 and an outlet port 41B provided on the other wall. These walls are opposite to each other as the walls sandwich a trajectory OT of a droplet DL.

The exhaust tube 42 is a tube that guides debris and cations to be exhausted and a gas generated from the debris and cations having reacted with the etching gas from the chamber 2 to the outside. The exhaust tube 42 has an exhaust tube 42A joined to the outlet port 41A and an exhaust tube 42B joined to the outlet port 41B. The exhaust tubes 42A and 42B extend in the directions orthogonal to the opening faces of the outlet ports 41A and 41B. The end portions of the exhaust tubes 42A and 42B opposite to their end portions joined to the outlet ports 41A and 41B are connected to the exhausters 43.

The exhausters 43 exhaust a residual gas in the chamber 2 from the outlet ports 41A and 41B through the corresponding exhaust tubes 42A and 42B. The residual gas exhausted from the exhausters 43 includes debris and cations, products generated by the debris and cations having reacted with the etching gas, and an etching gas that does not react with the debris and cations. Note that configurations may be provided in which the exhauster 43 exhausts a residual gas in the same amount as the amount of the etching gas supplied from the etching gas supply unit 9 to the inside of the chamber 2, and in which the exhauster 43 keeps the internal pressure in the chamber 2 nearly constant.

The magnetic field generating unit 44 generates a magnetic field ML for converging cations generated by turning the droplet DL into plasma in a plasma generation region 22 on the outlet ports 41A and 41B. The magnetic field generating unit 44 is configured, for example, of a pair of electromagnets 51 and 52 opposite to each other as the electromagnets 51 and 52 sandwich the chamber 2.

The electromagnet 51 has a superconducting coil 51A, a case 51B surrounding the superconducting coil 51A, and a current supply unit, not shown, connected to the superconducting coil 51A. The electromagnet 51 forms the magnetic field ML by supplying a current from the current supply unit to the superconducting coil 51A. The electromagnet 52 has a superconducting coil 52A, a case 52B surrounding the superconducting coil 52A, and a current supply unit, not shown, connected to the superconducting coil 52A. The electromagnet 52 forms the magnetic field ML by supplying an electric current from the current supply unit to the superconducting coil 52A.

The superconducting coils 51A and 52A are arranged in such a manner that the plasma generation region 22 is located in the middle area between the superconducting coils 51A and 52A. The superconducting coils 51A and 52A are arranged in such a manner that the exhaust tube 42A is inserted into a through hole 51H of the superconducting coil 51A, the exhaust tube 42B is inserted into a through hole 52H of the superconducting coil 52A, and the center axis of the exhaust tube 42A in the longitudinal direction is matched with the center axis of the exhaust tube 42B in the longitudinal direction. The center axes are matched with a magnetic field axis AX of the magnetic field ML.

In the magnetic field generating unit 44 configured of the pair of the electromagnets 51 and 52, the direction of the electric current supplied to the superconducting coil 51A in the electromagnet 51 is the same as the direction of the electric current supplied to the superconducting coil 52A in the electromagnet 52. In the case in which these electric currents are supplied to the superconducting coils 51A and 52A, the magnetic field ML is generated in which magnetic flux density is the highest near the superconducting coils 51A and 52A and is lower toward the plasma generation region 22. The magnetic field ML is sometimes referred to as a mirror magnetic field.

From the viewpoint of efficiently exhausting cations out of the outlet ports 41A and 41B, a mirror ratio is preferably decreased. The mirror ratio is the ratio of magnetic flux density near the superconducting coils 51A and 52A to the magnetic flux density in the plasma generation region 22 located in the middle area between the superconducting coils 51A and 52A. The shape of the magnetic field ML may be controlled in such a manner that the magnetic lines of force between the outlet port 41A and the plasma generation region 22 are nearly in parallel with the magnetic field axis AX and the magnetic lines of force between the outlet port 41B and the plasma generation region 22 are nearly in parallel with the magnetic field axis AX. The shape of the magnetic field ML is controlled, for example, based on the winding numbers of the superconducting coils 51A and 52A and the strength of the electric currents applied to the superconducting coils 51A and 52A.

Note that the magnetic field generating unit 44 is configured of the pair of the electromagnets 51 and 52. However, the magnetic field generating unit 44 may be configured of a pair of permanent magnets instead of the pair of the electromagnets 51 and 52.

3.2 Operation

Figure 3:
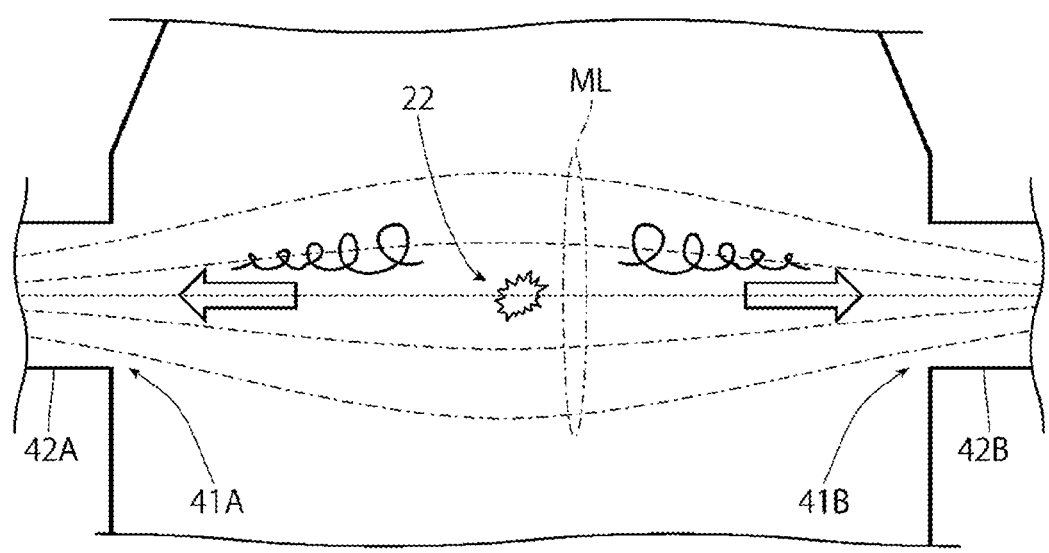
FIG. 3 is a diagram illustrating the migration of cations caused by target substances that have been turned into plasma.

As shown in FIG. 3, cations generated by turning the droplet DL into plasma in the plasma generation region 22 move depicting a rotating trajectory in a plane perpendicular to the magnetic lines of force as Lorentz force is applied to the cations.

In the case in which cations moving as described above have velocity components in the directions of the outlet ports 41A and 41B, the cations move while the cations are depicting a helical trajectory along the magnetic lines of force, and converge on the outlet ports 41A and 41B. The cations reach the inside of the exhaust tubes 42A and 42B from the outlet ports 41A and 41B, flow into the exhausters 43 on exhaust flows, and the cations are subjected to a predetermined exhaust process at the exhausters 43. As described above, the sputtering of the reflection plane 23A of the collector mirror 23 due to the collision of cations is reduced.

3.3 Problem

However, in the extreme UV light generation device according to the comparative example, the magnetic flux density of the magnetic field ML formed by the magnetic field generating unit 44 is the highest near the superconducting coils 51A and 52A and lower toward the plasma generation region 22. Thus, a part of cations, for example, subjected to a change in the trajectory sometimes returns from the outlet ports 41A and 41B to the plasma generation region 22.

As a result, cations generated at the inside of the chamber 2 reside, the residual cations collide against, for example, other cations or debris to produce new debris, and the debris is sometimes deposited on the window 21, the reflection plane 23A of the collector mirror 23, or other components. Consequently, a problem possibly occurs such as a reduction in the reflectance and transmittance of these optical devices. When the optical devices are contaminated due to the debris, the delivery of EUV light might be reduced, or no EUV light might be generated.

Therefore, embodiments below will describe, as examples, extreme UV light generation devices that reduce the contamination of optical devices due to debris.

4. First Embodiment 4.1 Configuration of a Part of an Extreme UV Light Generation Device Next, as a first embodiment, the configuration of an extreme UV light generation device will be described. Note that configurations similar to the configurations described above are designated by the same reference signs, and redundant descriptions will be omitted unless otherwise specified.

Figure 4:
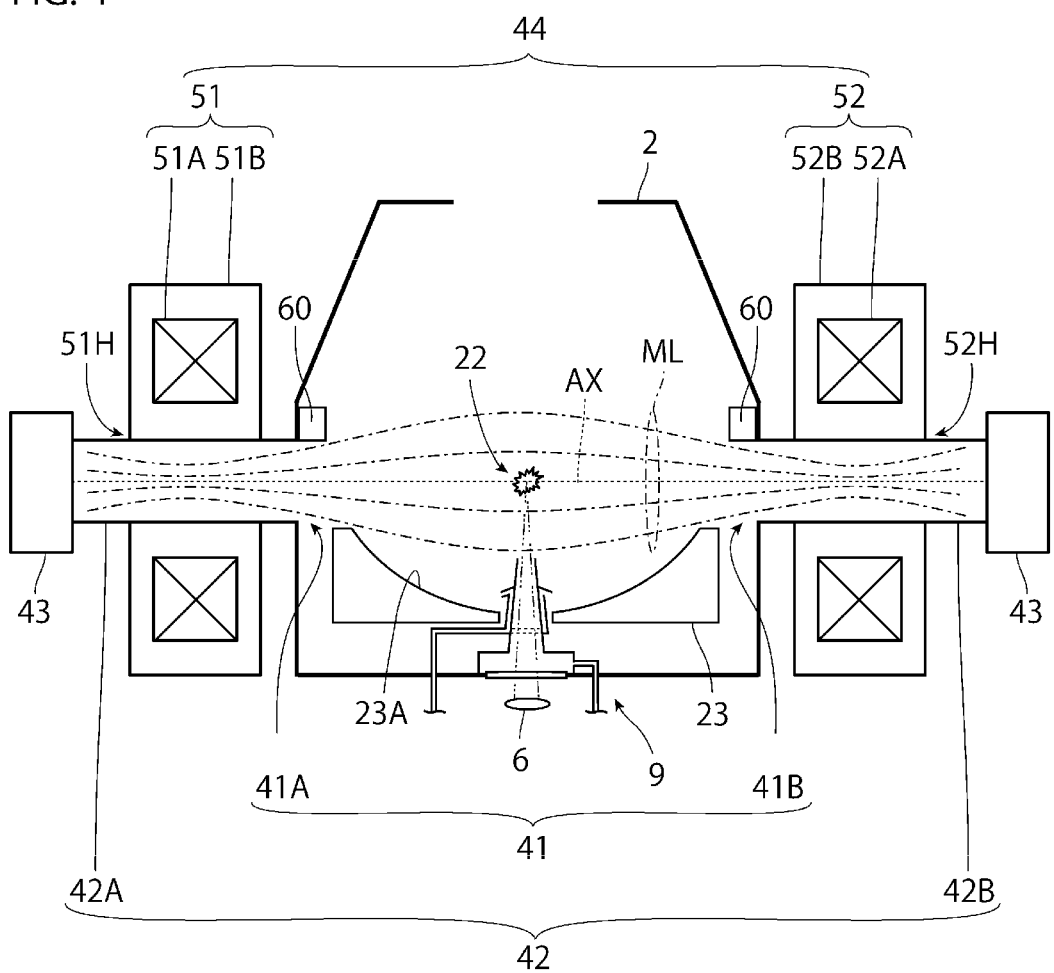
FIG. 4 is a schematic diagram of an exemplifying configuration of a part of an extreme UV light generation device according to a first embodiment.

As shown in FIG. 4, the extreme UV light generation device according to the embodiment is different from the extreme UV light generation device according to the comparative example in that an electron emission unit 60 is included to emit electrons neutralizing cations generated as debris from target substances that have been turned into plasma.

Outlet ports 41A and 41B are provided in the range in which the electrons emitted from the electron emission unit reach. In the case of the embodiment, the electron emission units 60 are placed on the walls of a chamber 2 near the outlet ports 41A and 41B. In the embodiment, the electron emission unit 60 placed on the wall of the chamber 2 near the outlet port 41A and the electron emission unit 60 placed on the wall of the chamber 2 near the outlet port 41B have the same configurations. However, the electron emission units 60 may have different configurations.

Figure 5:
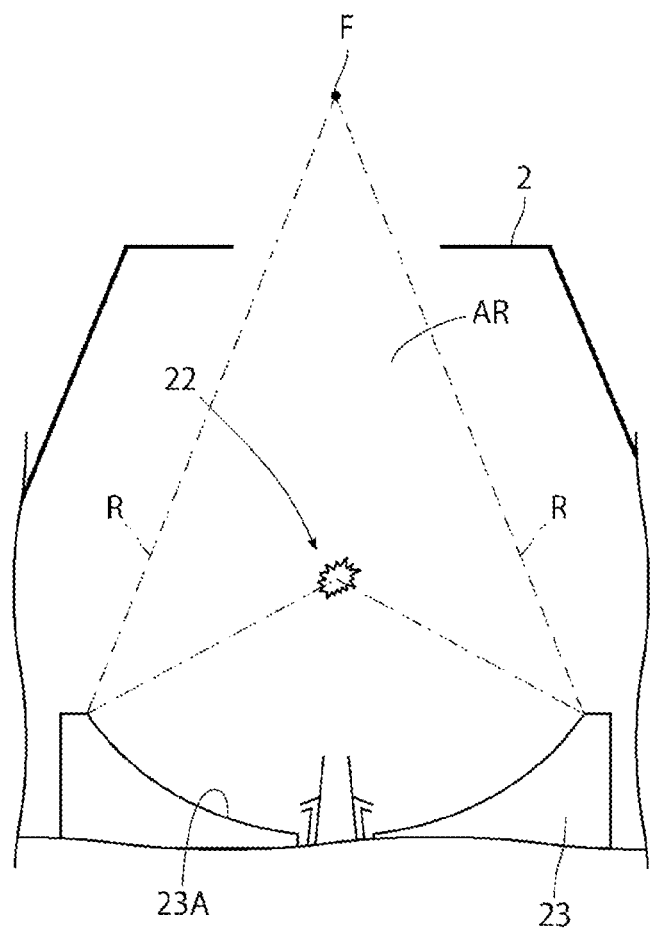
FIG. 5 is a diagram illustrative of the arrangement of an electron emission unit.

As shown in FIG. 5, regarding the relationship between the electron emission units 60 and a collector mirror 23, the electron emission units 60 are placed on the outer side of a region AR surrounded by a focal point F of the collector mirror 23, outermost light beams R of light flux focusing on the focal point F, and a reflection plane 23A of the collector mirror 23. Note that the region AR may be a region in which the reflection plane is projected onto a plane perpendicular to the reflection optical axes of the collector mirror 23. When the reflection plane 23A of the collector mirror 23 is viewed from the front from the focal point F side, the electron emission units 60 only have to be placed so as not to be overlapped with the reflection plane 23A.

Regarding the relationship between the electron emission units 60 and a magnetic field generating unit 44, the electron emission units 60 are placed at the positions on the chamber 2 side from the positions near superconducting coils 51A and 52A where magnetic flux density is the highest. Note that the electron emission units 60 may be placed on the walls of exhaust tubes 42A and 42B on the outer side of the chamber 2 near the outlet ports 41A and 41B as long as the electron emission units 60 are located on the chamber 2 side from the positions of the superconducting coils 51A and 52A where magnetic flux density is the highest.

Figure 6:
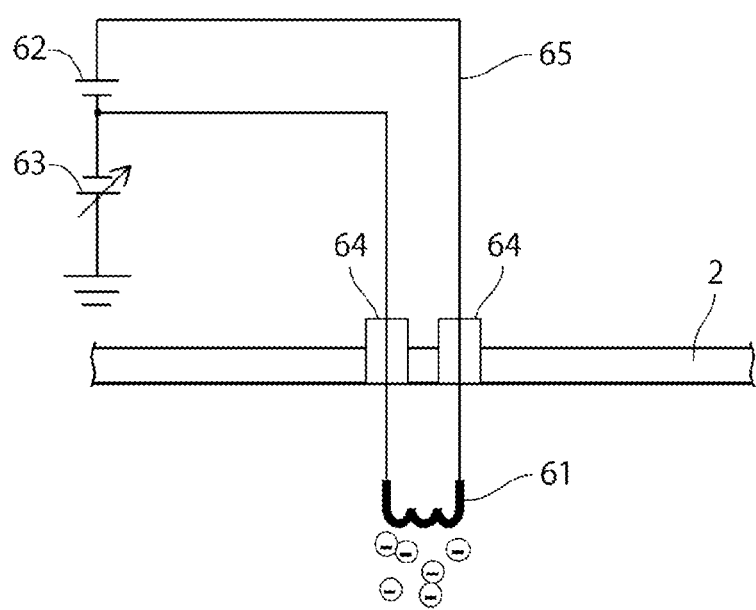
FIG. 6 is a schematic diagram of exemplifying configuration 1 of the electron emission unit.

As shown, for example, in FIG. 6, the electron emission unit 60 may have a configuration including a filament 61, a power supply 62, and a control power supply 63. The filament 61 is placed on the internal space of the chamber 2 along the inner wall surface of the chamber 2, and connected to the power supply 62 with a wire 65 passing through a feed through 64 provided on the wall of the chamber 2. Note that in the example shown in FIG. 6, the filament 61 is placed in the internal space of the chamber 2. However, a part of the filament 61 may be buried in the wall of the chamber 2 with the filament 61 in contact with the internal space of the chamber 2.

Examples of the materials of the filament 61 include metals, such as tungsten or tantalum. Note that a metal oxide, which has a low work function and easily emits electrons, such as barium oxide or lanthanum hexaboride, may be coated on the surface of the filament 61.

The power supply 62 may be a direct current power supply or an alternating power supply. The electric current of these power supplies ranges, for example, from about one to 50 A. The control power supply 63 is a bias power supply that negatively biases the filament 61 to the ground. The bias voltage of the control power supply 63 ranges, for example, from about one to 50 V.

In the electron emission unit 60 shown in FIG. 6, in the case in which the power supply voltage of the power supply 62 is applied to the filament 61 and an electric current is carried thorough the filament 61, thermoelectrons that are free electrons are generated in the filament 61. Since a negative bias voltage is applied to the filament 61, the thermoelectrons are ejected from the filament 61. As described above, the electron emission unit 60 shown in FIG. 6 emits electrons.

Figure 7:
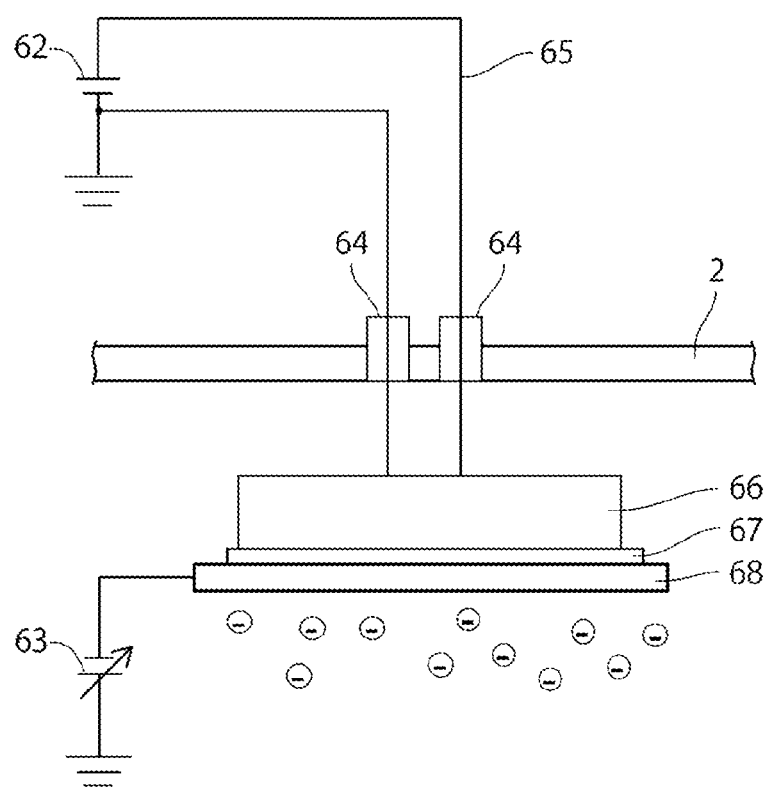
FIG. 7 is a schematic diagram of exemplifying configuration 2 of the electron emission unit.

As shown, for example, in FIG. 7, in the electron emission unit 60, a heater 66, an insulating plate 67, and a metal plate 68 may be adapted instead of the filament 61. The heater 66 is placed spaced from the inner wall surface of the chamber 2, and connected to the power supply 62 with the wire 65 passing through the feed through 64.

The insulating plate 67 is provided on the face of the heater 66 on the opposite side to the inner wall side of the chamber 2. Examples of the materials of the insulating plate 67 include alumina ceramics and aluminum nitride ceramics. Note that the materials of the insulating plate 67 are desirably materials of high thermal conductivity.

The metal plate 68 is provided on the face of the insulating plate 67 on the opposite side to the heater 66 side. The metal plate 68 is connected to the ground through the control power supply 63 that is a bias power supply for attracting electrons. The material of the metal plate 68 only has to be a metal having a low work function. Note that a substance having a low work function may be coated on the surface of the metal plate 68.

In the electron emission unit 60 shown in FIG. 7, in the case in which the power supply voltage of the power supply 62 is applied to heat the heater 66, the metal plate 68 is heated through the insulating plate 67, and thermoelectrons that are free electrons are generated in the metal plate 68. Since a negative bias voltage is applied to the metal plate 68, the thermoelectrons are ejected from the metal plate 68. As described above, the electron emission unit 60 shown in FIG. 7 emits electrons.

Figure 8:
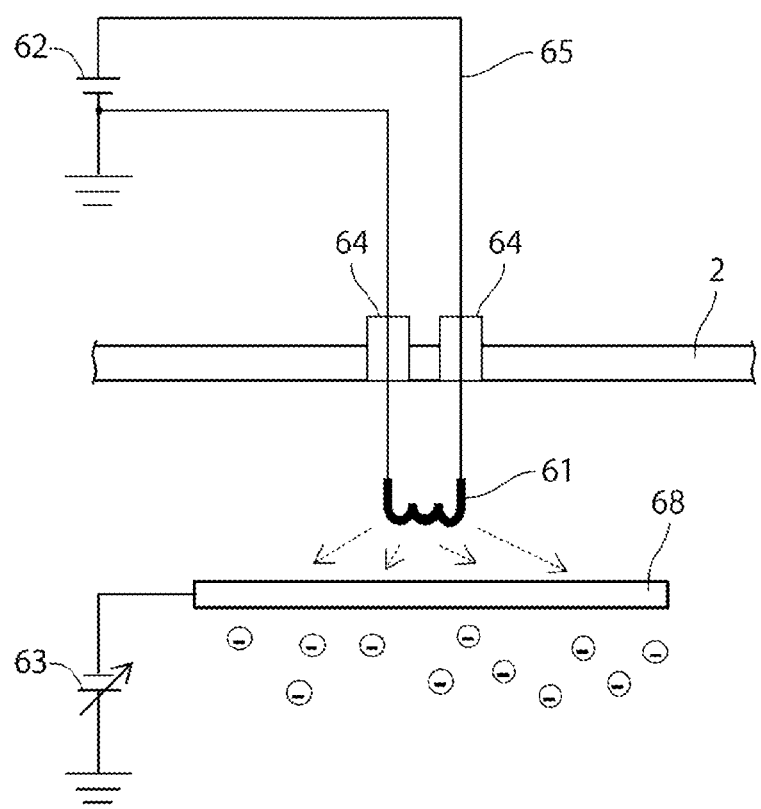
FIG. 8 is a schematic diagram of exemplifying configuration 3 of the electron emission unit.

As shown, for example, in FIG. 8, the electron emission unit 60 may have a configuration that combines the filament 61 and the power supply 62 shown in FIG. 6 with the metal plate 68 and the control power supply 63 shown in FIG. 7.

In the electron emission unit 60 shown in FIG. 8, the metal plate 68 is heated by radiation from the filament 61. Thermoelectrons are ejected from the metal plate 68 depending on the heating as described above. As described above, the electron emission unit 60 shown in FIG. 8 emits electrons more than the electron emission unit 60 shown in FIG. 6 or FIG. 7 does.

4.2 Operation

A part of the electrons emitted from the electron emission unit 60 reacts with cations moving to near the outlet ports 41A and 41B while the cations are depicting a helical trajectory along the magnetic lines of force. Thus, the cations are neutralized, and neutralized substances are obtained due to the neutralization of the cations.

The neutralized substances are not affected by the magnetic field ML generated from the magnetic field generating unit 44. Consequently, the neutralized substances are prevented from returning to the plasma generation region 22 because of the magnetic field ML, and flow into the exhausters 43 on exhaust flows. Note that stannane generated by the reaction of the etching gas with debris and cations and the etching gas that has not reacted also flow into the exhausters 43 on exhaust flows similarly to the neutralized substances.

4.3 Effect

In the extreme UV light generation device according to the embodiment, the magnetic field ML is generated with the magnetic field generating unit 44 in such a manner that cations converge toward the outlet ports 41A and 41B, and the electron emission unit 60 is placed in such a manner that electrons are delivered to the outlet ports 41A and 41B and the regions around the outlet ports 41A and 41B.

Thus, the electron emission unit 60 supplies electrons having negative space charges to near the outlet ports 41A and 41B, and thus attracts cations near the outlet ports 41A and 41B. Consequently, the electron emission unit 60 gives force to cations present at the inside of the chamber 2. The force is inverse to the force that returns the cations from the outlet ports 41A and 41B to the plasma generation region 22. Therefore, the electron emission unit 60 positively attracts the cations to the exhaust tubes 42A and 42B.

The electron emission unit 60 neutralizes the cations attracted to the outlet ports 41A and 41B sides with the electrons, and hence the electron emission unit 60 eliminates the influence of the magnetic field ML generated by the magnetic field generating unit 44. Accordingly, the electron emission unit 60 enables a great reduction in the amount of cations going from the outlet ports 41A and 41B to the plasma generation region 22.

As described above, the extreme UV light generation device attracts the cations to the outlet ports 41A and 41B sides with the electrons as well as the device neutralizes the cations in order to prevent the cations from being affected by the magnetic field ML. Thus, the extreme UV light generation device reduces the residual cations having been generated at the inside of the chamber 2. Accordingly, the extreme UV light generation device according to the embodiment enables a reduction in the generation of new debris due to the collision of the residual cations against existing debris. Consequently, the extreme UV light generation device according to the embodiment enables a reduction in the contamination of the optical devices due to debris.

5. Second Embodiment 5.1 Configuration of a Part of an Extreme UV Light Generation Device Next, as a second embodiment, the configuration of a part of an extreme UV light generation device will be described. Note that configurations similar to the configurations described above are designated by the same reference signs, and redundant descriptions will be omitted unless otherwise specified.

Figure 9:
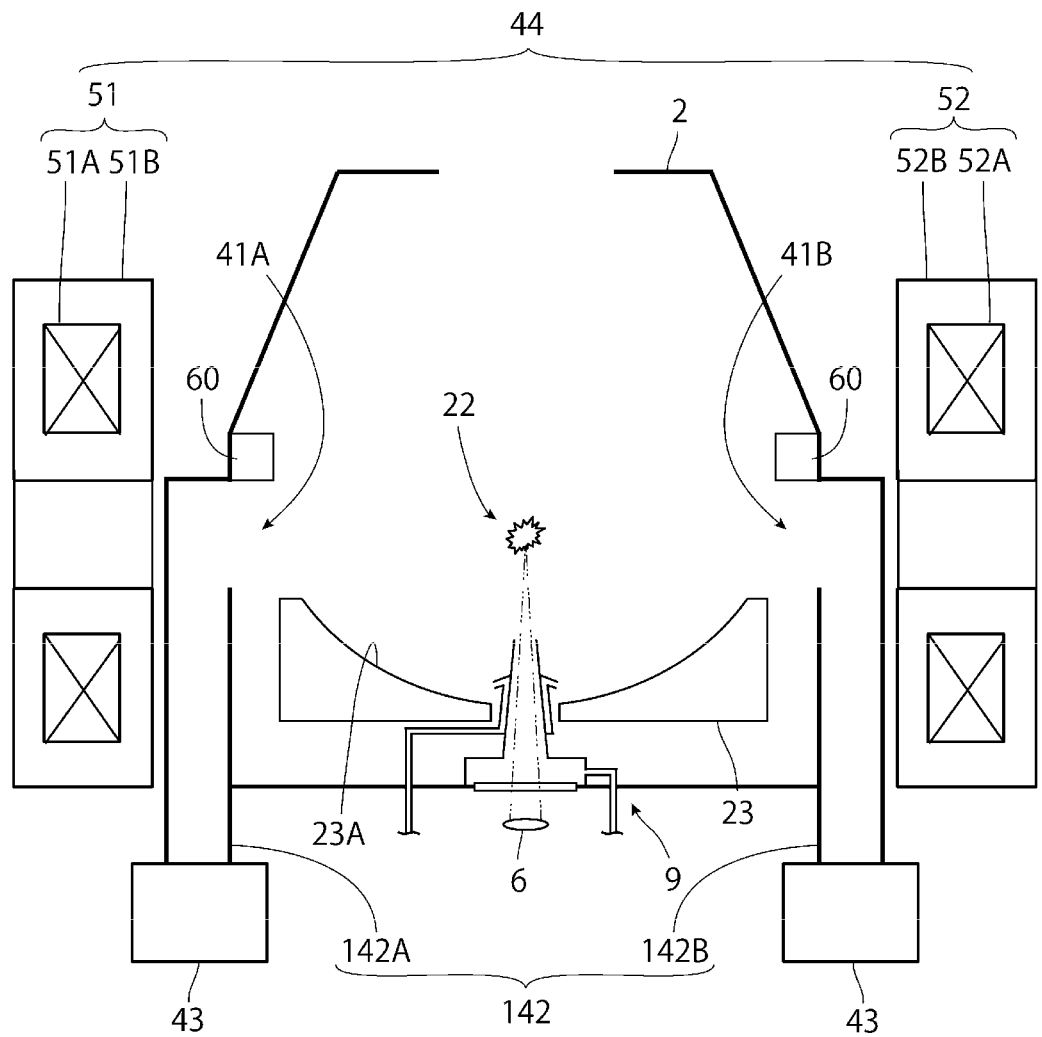
FIG. 9 is a schematic diagram of an exemplifying configuration of a part of an extreme UV light generation device according to a second embodiment.

As shown in FIG. 9, the extreme UV light generation device according to the embodiment is different from the extreme UV light generation device according to the first embodiment in that an exhaust tube 142 is included instead of the exhaust tube 42.

The exhaust tube 142 has an exhaust tube 142A joined to an outlet port 41A and an exhaust tube 142B joined to an outlet port 41B. The exhaust tubes 142A and 142B have bends that are bent in the directions nearly orthogonal to the opening faces of the outlet ports 41A and 41B. The exhaust tubes 142A and 142B extend between cases 51B and 52B and a chamber 2 along the bending directions.

Note that the bends are bent in the directions nearly orthogonal to the opening faces of the outlet ports 41A and 41B in the embodiment. However, the bends do not necessarily have to be bent in the directions nearly orthogonal to the opening faces as long as the bends are bent in the directions crossing the opening faces. In the embodiment, the tubular portions extending from the bends to the exhaust side extend between the cases 51B and 52B and the chamber 2. However, the tubular portions do not necessarily have to extend between the cases 51B and 52B and the chamber 2.

5.2 Operation

A part of the electrons emitted from the electron emission unit 60 reacts with cations moving to near the outlet ports 41A and 41B while the cations are depicting a helical trajectory along the magnetic lines of force, and the electrons are turned into neutralized substances. The neutralized substances are not affected by the magnetic field ML, and the substances are exhausted on exhaust flows.

5.3 Effect

Similarly to the first embodiment, the extreme UV light generation device according to the embodiment attracts the cations to the outlet ports 41A and 41B sides with the electrons as well as the device neutralizes the cations in order to prevent the cations being affected by the magnetic field ML. Thus, even though the exhaust tubes 142A and 142B are bent at the places at the immediate downstream of the outlet ports 41A and 41B, the extreme UV light generation device neutralizes the cations, and flows the cations into the exhaust tubes 142A and 142B. Accordingly, similarly to the first embodiment, the extreme UV light generation device according to the embodiment enables a reduction in the residual cations generated at the inside of the chamber 2.

6. Third Embodiment 6.1 Configuration of a Part of an Extreme UV Light Generation Device Next, as a third embodiment, the configuration of a part of an extreme UV light generation device will be described. Note that configurations similar to the configurations described above are designated by the same reference signs, and redundant descriptions will be omitted unless otherwise specified.

Figure 10:
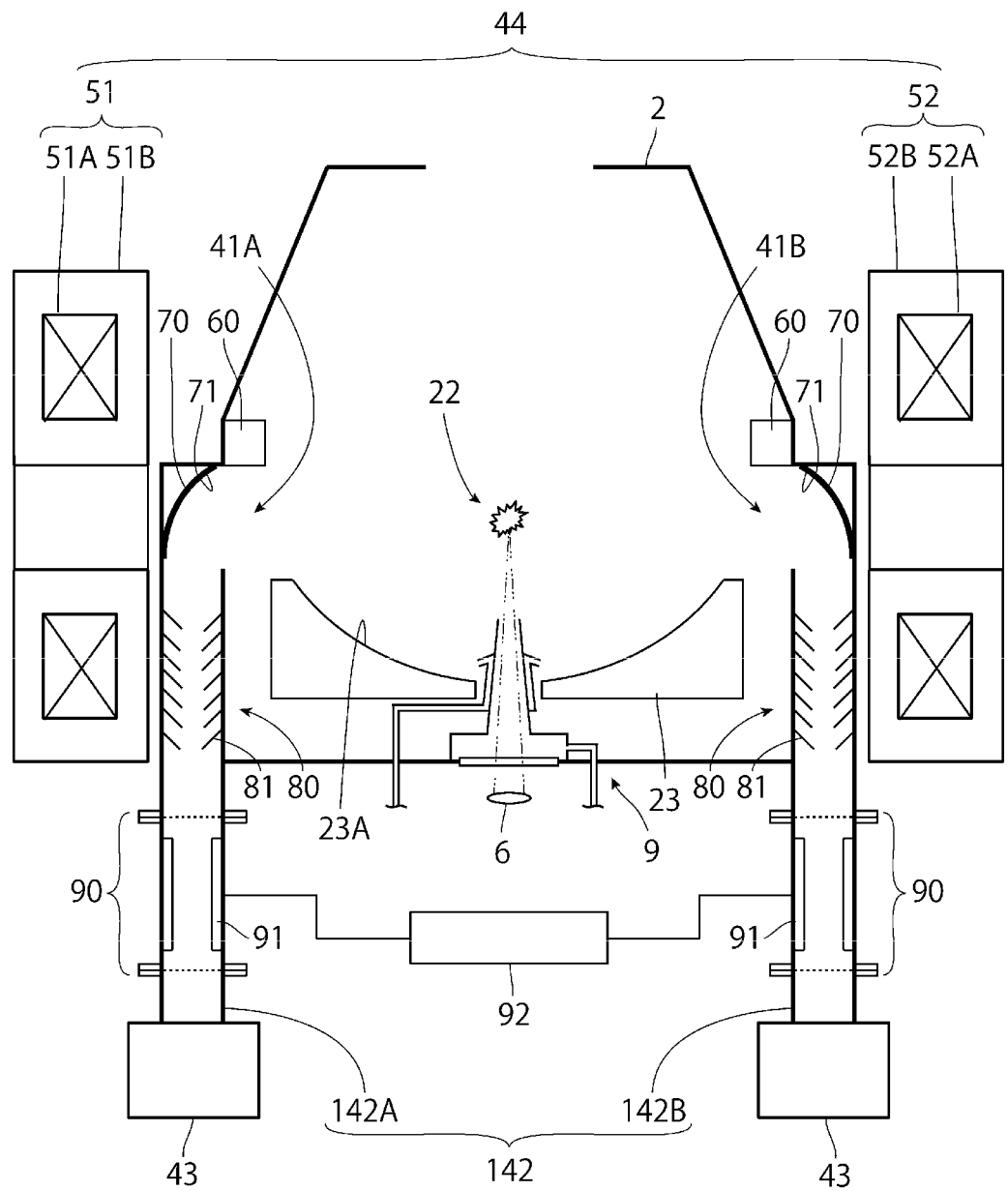
FIG. 10 is a schematic diagram of an exemplifying configuration of a part of an extreme UV light generation device according to a third embodiment.

As shown in FIG. 10, the extreme UV light generation device according to the embodiment is different from the extreme UV light generation device according to the second embodiment in that a turning member 70, a backflow prevention member 80, and a trapping member 90 are arranged at the inside of exhaust tubes 142A and 142B.

The turning member 70 is provided at each of the bends of the exhaust tubes 142A and 142B. The turning member 70 has a curved surface 71 that changes the direction of neutralized substances guided from each of outlet ports 41A and 41B to the extending directions of the tubular portions extending on the exhaust side. In the embodiment, the extending directions of the tubular portions extending on the exhaust side are the directions nearly orthogonal to the opening faces of the outlet ports 41A and 41B.

The backflow prevention member 80 prevents the backflow of neutralized substances moving in the inside parts of the exhaust tubes 142A and 142B along the exhaust flow direction. The backflow prevention member 80 has a configuration in which the inside part is narrower toward the exhaust directions of the exhaust tubes 142A and 142B. For example, the backflow prevention member 80 has walls 81. The walls make the inside part narrower toward the exhaust directions of the exhaust tubes 142A and 142B. The walls 81 may be tubes in a truncated cone shape or may be fin plates. Note that in the embodiment, the walls 81 are placed spaced with a predetermined gap along the longitudinal directions of the exhaust tubes 142A and 142B. However, one wall 81 may be provided.

The trapping member 90 traps neutralized substances moving in the inside parts of the exhaust tubes 142A and 142B along the exhaust flow direction. The trapping member includes a heater 91. The trapping member 90 is configured as a part of each of the exhaust tubes 142A and 142B, and removably mounted on the other parts of the exhaust tubes 142A and 142B. The heater 91 is driven with a heater power supply 92. The heater 91 heats neutralized substances, and precipitates and attaches target substances on the surface of the heater 91. Note that in the case in which the neutralized substance is a stannane gas at room temperature, tin precipitates as a target substance on the surface of the heater 91.

6.2 Operation

The electrons emitted from the electron emission units 60 attract cations to the outlet ports 41A and 41B sides, and the neutralized substances obtained by the reaction of the cations with the electrons enter the outlet ports 41A and 41B. The substances go to the turning members 70 on exhaust flows, and collide against the curved surfaces 71.

The neutralized substances having collided against the curved surfaces 71 of the turning members 70 change their traveling directions along the curved surfaces 71 to the extending directions of the tubular portions extending on the exhaust sides. The substances pass through the backflow prevention members 80, and are guided to the trapping members 90. Here, in the case in which, among the neutralized substances having changed their traveling directions along the curved surfaces 71, there are neutralized substances going back in the direction reverse to the exhaust direction because the substances collide, for example, against the inner walls of the exhaust tubes 142A and 142B, the substances are trapped at the walls 81 of the backflow prevention members 80.

The neutralized substances guided to the trapping members 90 are heated by the heaters 91, and the substances precipitate and attach to the surfaces of the heaters 91. The neutralized substances that do not precipitate on the surfaces of the heaters 91 after guided to the trapping member 90 flow into the exhausters 43 on exhaust flows.

6.3 Effect

The extreme UV light generation device according to the embodiment is provided with the turning member 70 having the curved surface 71 at each of the bends of the exhaust tubes 142A and 142B. Thus, even though the exhaust tubes 142A and 142B are bent, the traveling directions of the neutralized substances guided from the outlet ports 41A and 41B are smoothly changed along the curved surfaces 71 of the turning members 70. Accordingly, even though the neutralized substances flow from the outlet ports 41A and 41B into the exhaust tubes 142A and 142B at excessive velocity, the extreme UV light generation device according to the embodiment enables a reduction in the neutralized substances returning to the inside of the chamber 2.

In the extreme UV light generation device according to the embodiment, the backflow prevention member 80 reduces the backflow of neutralized substances moving in the inside parts of the exhaust tubes 142A and 142B along the exhaust flow direction. Thus, this further enables a reduction in the neutralized substances returning to the inside of the chamber 2.

In the extreme UV light generation device according to the embodiment, the trapping member 90 precipitates and collects the neutralized substances in each of the inside parts of the exhaust tubes 142A and 142B. Thus, this further enables a reduction in the neutralized substances returning to the inside of the chamber 2.

In the embodiment, the trapping members 90 are removably provided on the exhaust tubes 142A and 142B. Thus, this enables the collection of precipitated target substances by dismounting the trapping members 90 in maintenance. Accordingly, maintenance time is shortened, and maintenance is facilitated.

Note that a configuration may be provided in which the backflow prevention member 80 and the trapping member 90 according to the embodiment are included in each of the exhaust tubes 42A and 42B according to the first embodiment.

7. Fourth Embodiment

7.1 Configuration of a Part of an Extreme UV Light Generation Device

Next, as a fourth embodiment, the configuration of a part of an extreme UV light generation device will be described. Note that configurations similar to the configurations described above are designated by the same reference signs, and redundant descriptions will be omitted unless otherwise specified.

Figure 11:
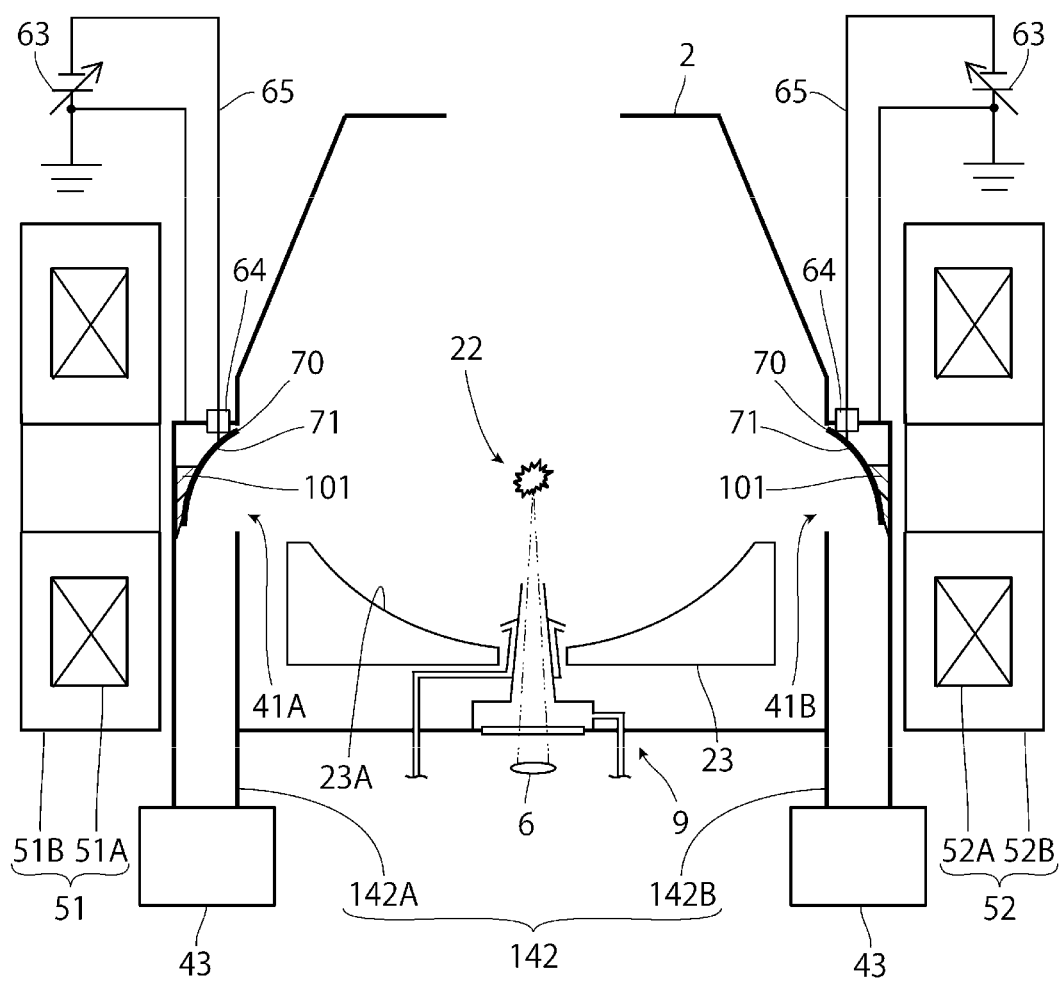
FIG. 11 is a schematic diagram of an exemplifying configuration of a part of an extreme UV light generation device according to a fourth embodiment.

As shown in FIG. 11, the extreme UV light generation device according to the embodiment is different from the extreme UV light generation device according to the third embodiment in that secondary electrons are emittable at a turning member 70 and the backflow prevention members 80 and the trapping members 90 are omitted. Note that one or both of the backflow prevention members 80 and the trapping members 90 may be included.

The turning member 70 according to the embodiment is provided on each of the inner walls of exhaust tubes 142A and 142B through an insulating member 101 in a non-contact manner to the exhaust tubes 142A and 142B. The turning member 70 is electrically isolated from each of the exhaust tubes 142A and 142B. The turning member 70 is connected to a control power supply 63 that is a bias power supply through a wire 65 passing through a feed through 64. The feed through 64 is provided on each of the walls of the exhaust tubes 142A and 142B.

The turning member 70 is configured of a material that emits secondary electrons by the collision of cations. An example of the material of the turning member 70 includes a metal, such as tungsten or tantalum. Note that the material is preferably a metal oxide, which has a low work function and easily emits electrons, such as barium oxide or lanthanum hexaboride. Alternatively, the material of the turning member 70 may be a conductive material having a coating of a metal oxide, such as barium oxide or lanthanum hexaboride.

7.2 Operation

Cations converge toward outlet ports 41A and 41B corresponding to the trajectory due to the magnetic field ML generated by a magnetic field generating unit 44. The cations partially flow from the outlet ports 41A and 41B into the exhaust tubes 142A and 142B, and collide against a curved surface 71 of the turning member 70.

The collision sometimes causes the generation of secondary electrons in the turning member 70. Since a negative bias voltage is applied to the turning member 70, the secondary electrons generated in the turning member 70 are ejected from the turning member 70.

In the case in which cations successively collide against the curved surface 71 of the turning member 70 to increase the temperature of the turning member 70, thermoelectrons that are free electrons are generated in the turning member 70, and the thermoelectrons are ejected from the turning member 70.

The electrons emitted from the turning member 70 as described above react with the cations converging toward the outlet ports 41A and 41B corresponding to the trajectory due to the magnetic field ML generated by the magnetic field generating unit 44. Thus, the cations are neutralized, and neutralized substances are obtained due to the neutralization of the cations.

The neutralized substances are obtained from the neutralization of the cations, which have flowed from the outlet ports 41A and 41B into the exhaust tubes 142A and 142B, collided against the curved surface 71 of the turning member 70, and then neutralized. The curved surface 71 changes the traveling direction of the neutralized substances to the extending direction of the tubular portion extending on the exhaust side. The substances are guided to the exhauster 43.

7.3 Effect

In the extreme UV light generation device according to the embodiment, the turning member 70 changes the traveling direction of the neutralized substances as well as the turning member 70 emits secondary electrons due to the collision of cations. That is, the turning member 70 also serve as the electron emission unit 60, and this enables a reduction in the size of the extreme UV light generation device, compared with the case in which the turning member 70 and the electron emission unit 60 are separately provided as in the third embodiment. The turning member 70 emits secondary electrons as well as thermoelectrons, and hence this enables the improvement of the neutralization efficiency of cations.

Note that a configuration may be provided in which the electron emission unit 60 of the first embodiment is provided on the wall of the chamber 2 near the outlet ports 41A and 41B of the embodiment. With this configuration, this further enables the improvement of the neutralization efficiency of cations. A configuration may be provided in which the power supply 62 is connected to the turning member 70, the power supply voltage of the power supply 62 is applied to the turning member 70 to heat the member 70, and thermoelectrons are emitted from the turning member 70. With this configuration, a larger amount of thermoelectrons is stably emitted, and hence this enables the improvement of the neutralization efficiency of cations, compared with the case in which the temperature of the turning member 70 is secondarily increased by the collision of cations.

8. Exemplifying Modification

As described above, the foregoing embodiments are described as examples. However, the present disclosure is not limited to the foregoing embodiments. The foregoing embodiments may be modified.

For example, in the first embodiment, the electron emission unit 60 is provided on the wall of the chamber 2 near the outlet ports 41A and 41B. However, the electron emission unit 60 may be provided on each of the walls of the exhaust tubes 42A and 42B near the outlet ports 41A and 41B as in the fourth embodiment. A configuration may be provided in which the electron emission unit 60 may be provided in each of the insides of the exhaust tubes 42A and 42B inserted into the through holes 51H and 52H of the superconducting coils 51A and 52A of the electromagnets 51 and 52. As described above, in the case in which the electron emission unit 60 is provided in each of the insides of the exhaust tubes 42A and 42B, cations converging toward the insides of the exhaust tubes 42A and 42B are neutralized. Thus, this enables a further reduction in the backflows of the neutralized substances and the cations into the chamber 2.

In the foregoing embodiments, the outlet ports 41A and 41B are provided on the walls of the chamber 2 opposite to each other, and the pair of the electromagnets 51 and 52 is provided on the outer side of the outlet ports 41A and 41B. However, for example, a configuration may be provided in which one of the outlet ports 41A and 41B is omitted and one of the electromagnets 51 and 52 with the omitted one of the outlet ports 41A and 41B is also omitted. For example, a configuration may be provided in which the magnetic field generating unit 44 generates a magnetic field to converge cations, which flow from the outlet port 41A on the electromagnet 51 side, on the outlet port 41B on the electromagnet 52 side through the plasma generation region 22. For example, the electromagnets 51 and 52 or magnets, such as permanent magnets, may be provided at the inside of the chamber 2. In short, the magnetic field generating unit only has to have a configuration that generates a magnetic field to converge cations on the outlet port. The cations are generated from the target substances that have been turned into plasma in the plasma generation region.

The description above is merely examples, not limitation. Thus, it is apparent to a person skilled in the art that the embodiments of the present disclosure can be modified and altered without deviating from the scope of the appended claims.

The terms used throughout the specification and the appended claims have to be interpreted as "non-limiting" terms. For example, the term "to include" or "to be included" has to be interpreted to "include non-limiting components". The term "to have" has to be interpreted to "have non-limiting components". The indefinite articles "a" and "an" described in the specification and the appended claims have to be interpreted that the indefinite articles mean "at least one" or "one or more".

What is claimed is:

1. An extreme UV light generation device comprising:
a chamber having a plasma generation region at an inside of the chamber, the chamber receiving a target substance externally supplied to the plasma generation region;
an outlet port provided on the chamber;
a magnetic field generating unit configured to generate a magnetic field to converge cations on the outlet port, the cations being generated from the target substance that has been turned into plasma in the plasma generation region;
an electron emission unit configured to emit electrons neutralizing the cations; and
an exhaust tube joined to the outlet port and through which a neutralized substance obtained by neutralizing the cations flows.

2. The extreme UV light generation device according to claim 1, wherein
the outlet port is provided in a range which electrons emitted from the electron emission unit reach.

3. The extreme UV light generation device according to claim 1, wherein
in the chamber, a collector mirror is provided, the collector mirror being configured to reflect and focus, on a focal point, extreme ultraviolet light generated from the target substance that has been turned into plasma in the plasma generation region, and
the electron emission unit is placed on an outer side of a region surrounded by the focal point, an outermost light beam of a light flux focused on the focal point, and a reflection plane of the collector mirror.

4. The extreme UV light generation device according to claim 1, wherein
the electron emission unit is placed on a wall of the chamber near the outlet port or a wall of the exhaust tube near the outlet port.

5. The extreme UV light generation device according to claim 1, wherein
the magnetic field generating unit is configured of a pair of magnets opposite to each other as the magnets sandwich the chamber, and
the electron emission unit is placed on a chamber side from a position where magnetic flux density is highest.

6. The extreme UV light generation device according to claim 1, wherein
the magnetic field generating unit is configured of a magnet placed on an outside of the chamber,
the exhaust tube is inserted into a through hole provided on the magnet, and
the electron emission unit is placed in an inside of the exhaust tube inserted into the through hole.

7. The extreme UV light generation device according to claim 1, wherein
the exhaust tube has a bend that is bent in a direction crossing an opening face of the outlet port, and
at the bend, a turning member is provided, the turning member having a curved surface configured to change a traveling direction of the neutralized substance guided from the outlet port to a direction crossing the opening face of the outlet port.

8. The extreme UV light generation device according to claim 7, wherein
the turning member is configured of a material that emits secondary electrons due to collision of the cations.

9. The extreme UV light generation device according to claim 8, wherein
the electron emission unit is configured to emit electrons from the turning member.

10. The extreme UV light generation device according to claim 7, wherein
the electron emission unit is configured to emit electrons from the turning member.

11. The extreme UV light generation device according to claim 1, wherein
in an inside of the exhaust tube, a backflow prevention member is provided, the backflow prevention member being configured to reduce a backflow of the neutralized substance, and the backflow prevention member is configured in which an inside part is narrower toward an exhaust direction of the exhaust tube.

12. The extreme UV light generation device according to claim 1, wherein in an inside of the exhaust tube, a trapping member is provided, the trapping member being configured to trap the neutralized substance, and the trapping member includes a heater configured to heat and precipitate the neutralized substance.

13. The extreme UV light generation device according to claim 12, wherein the heater is removably mounted on an inner wall of the exhaust tube.

\* \* \* \* \*